United States Patent
Arz et al.

(10) Patent No.: US 7,154,270 B2
(45) Date of Patent: Dec. 26, 2006

(54) GRADIENT COIL SYSTEM FOR A MAGNETIC RESONANCE TOMOGRAPHY DEVICE HAVING A MORE EFFECTIVE COOLING

(75) Inventors: Winfried Arz, Nürnberg (DE); Michael Schaaf, Shenzhen (CN); Johann Schuster, Oberasbach (DE); Lothar Schön, Neunkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/513,244

(22) PCT Filed: Apr. 16, 2003

(86) PCT No.: PCT/DE03/01288

§ 371 (c)(1),
(2), (4) Date: Nov. 2, 2004

(87) PCT Pub. No.: WO03/093853

PCT Pub. Date: Nov. 13, 2003

(65) Prior Publication Data

US 2005/0168222 A1 Aug. 4, 2005

(30) Foreign Application Priority Data

May 2, 2002 (DE) .............................. 102 19 768

(51) Int. Cl.
*G01V 3/00* (2006.01)

(52) U.S. Cl. .................................................... 324/318

(58) Field of Classification Search ................. 324/318
See application file for complete search history.

(56) References Cited

U.S. PATENT DOCUMENTS

| 3,718,181 | A | * | 2/1973 | Reilly et al. ................. 165/180 |
| 3,932,096 | A | * | 1/1976 | Kartman ..................... 425/398 |
| 5,570,021 | A | * | 10/1996 | Dachniwskyj et al. ...... 324/318 |
| 6,111,412 | A | | 8/2000 | Boemmel et al. |
| 6,236,207 | B1 | | 5/2001 | Arz et al. |
| 6,642,717 | B1 | | 11/2003 | Dietz et al. |

FOREIGN PATENT DOCUMENTS

| DE | 197 22 211 | | 8/1998 |
| WO | WO 94/20862 | | 9/1994 |
| WO | WO 99/45407 | * | 9/1999 |

OTHER PUBLICATIONS

Agari Y et al., "Thermal Conductivity of a Polymer Filled with Particles in the Wide Range from Low to Super-High Volume Content", Journal of Applied Polymer Science, vol. 40, p. 929-941 (1990).*
"Practical Design of a High-Strength Breast Gradient Coil," Maier et al., Magnetic Resonance in Medicine, vol. 39 (1998) pp. 392-401.
"MR Gradient Coil Heat Dissipation," Chu et al., Magnetic Resonance in Medicine, vol. 34 (1995) pp. 125-132.
Kunstoff-Taschenbuch, Pabst (1995), pp. 126-127.

* cited by examiner

*Primary Examiner*—Brij Shrivastav
*Assistant Examiner*—Megann Vaughn
(74) *Attorney, Agent, or Firm*—Schiff Hardin LLP

(57) ABSTRACT

A gradient coil system for a magnetic resonance apparatus has gradient coils and at least one cooling tube for cooling the gradient coils using a coolant flowing through the cooling tube. The cooling tube is formed of a flexible thermoplastic material, augmented with a filler, and has a thermal conductivity greater than 0.5 W/mK.

8 Claims, 5 Drawing Sheets

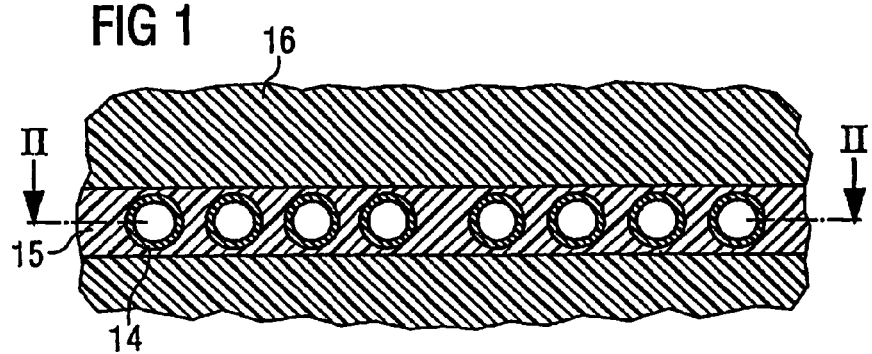
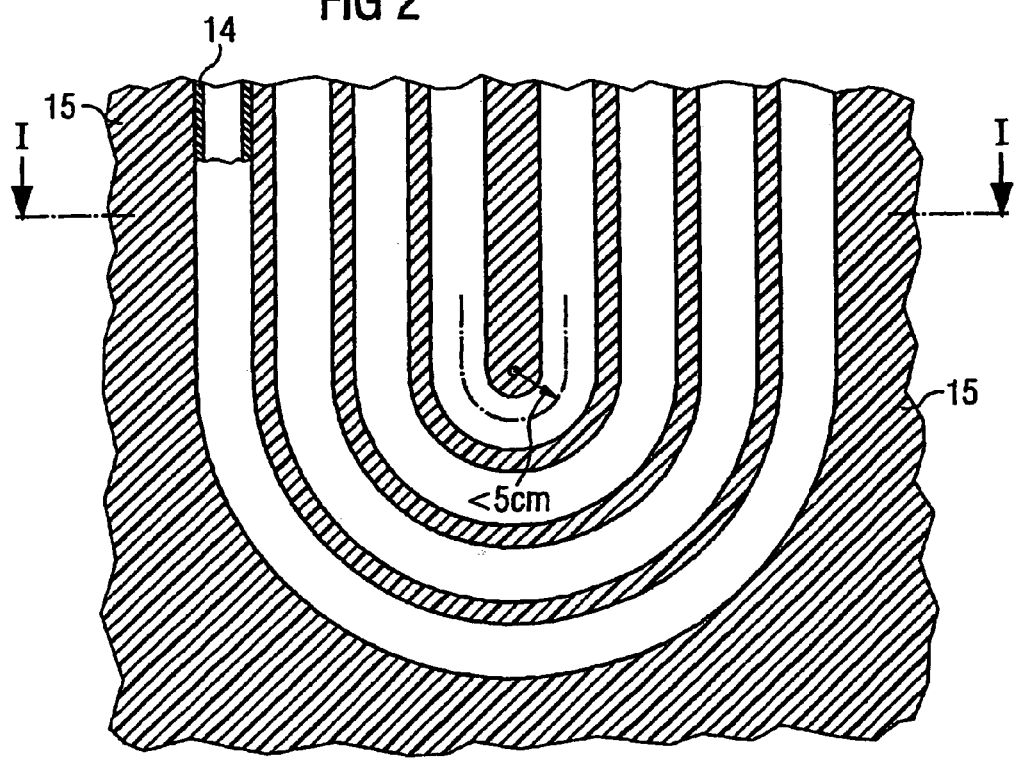

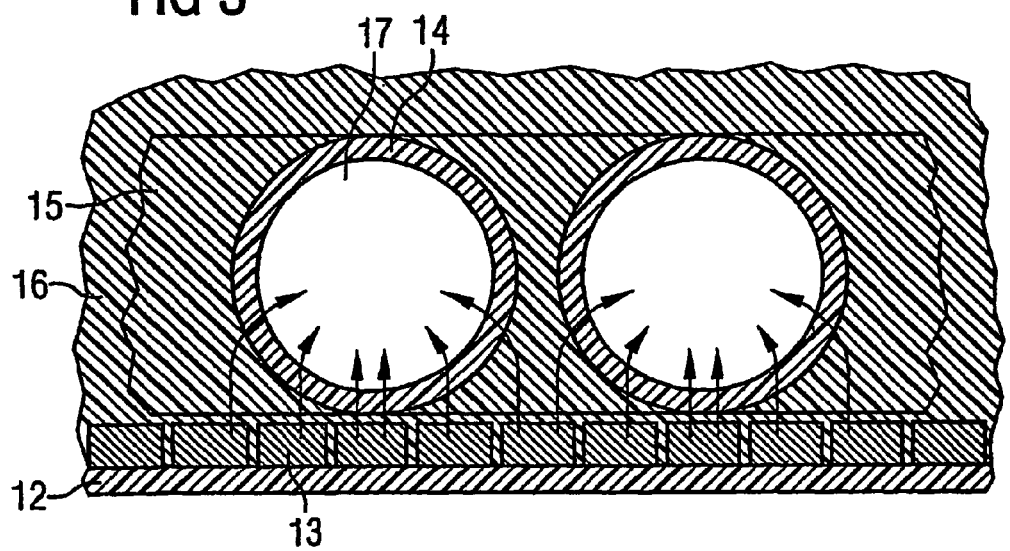
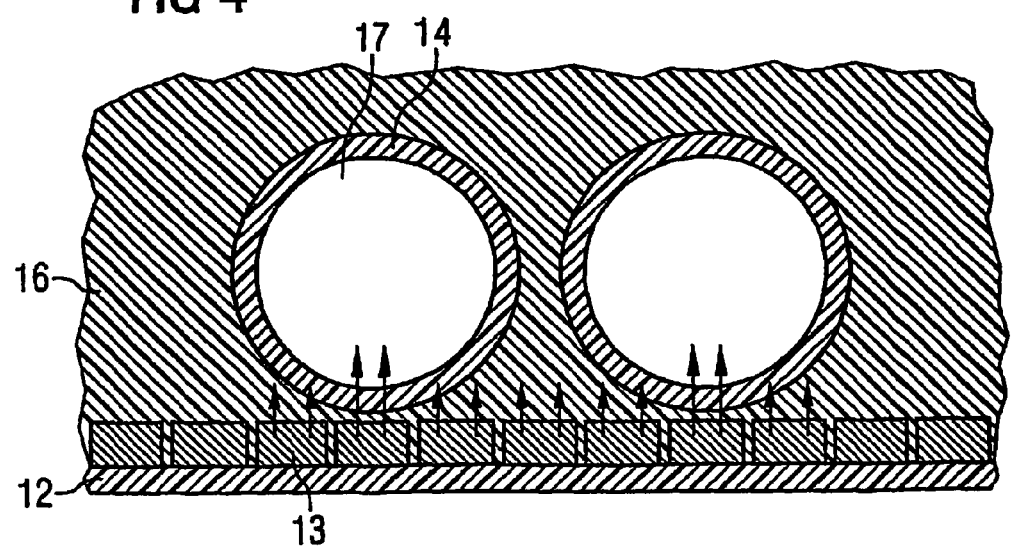

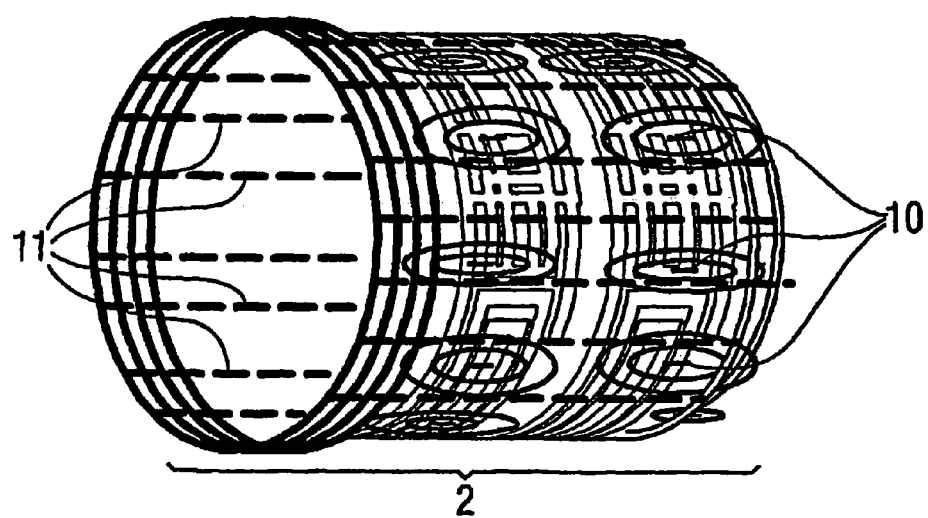

GRADIENT COIL SYSTEM FOR A MAGNETIC RESONANCE TOMOGRAPHY DEVICE HAVING A MORE EFFECTIVE COOLING

BACKGROUND OF THE INVENTION

1. Field of the Invention

The present invention concerns in general the cooling of a gradient coil as used in magnetic resonance tomography (MRT). The present invention in particular concerns the application of cooling tubes as well as a sealing compound for better heat dissipation at the gradient coils.

2. Description of the Prior Art

MRT is based on the physical phenomenon of nuclear magnetic resonance and has been successfully used as an imaging method for over 15 years in medicine and biophysics. In this examination modality, the subject is exposed to a strong, constant magnetic field. The nuclear spins of the atoms in the subject, which were previously randomly oriented, thereby align. Radio-frequency energy can now excite these "ordered" nuclear spins to a specific oscillation (resonance frequency). In MRT, this oscillation generates the actual measurement signal (RF response signal) which is acquired by means of appropriate reception coils.

For the image reconstruction, the exact information about the origination location of the RF response signal (spatial information or spatial coding) is a requirement. This spatial information is acquired via magnetic auxiliary fields (magnetic gradient fields) relative to the static magnetic field along the three spatial directions. In comparison to the main field, these gradient fields are small and are generated in the patient opening of the magnet by additional conductor coils. The entire magnetic field, and therewith the resonance frequency as well, is different in each volume element due to these gradient fields. If a definite resonance frequency is emitted, only the atomic nuclei that are at a location at which the magnetic field satisfies a corresponding resonance condition can be excited. Suitable modification of the gradient fields enables it to definitely shift the location of such a volume element in which the resonance condition is satisfied, and thus to scan the desired region.

MRT allows a free selection of the layer to be imaged, so slice images of the human body can be acquired in all directions. MRT today makes use of high gradient capacities that enable an excellent image quality with measurement times in the range of seconds and minutes.

The constant technical development of the components of MRT apparatuses and the introduction of faster imaging sequences continuously makes more fields of use in medicine available to MRT. Real time imaging for the support of minimally-invasive surgery, functional imaging in neurology and perfusion measurement in cardiology are only a few examples.

The basic design of one of the basic components of such an MRT apparatus is shown in FIG. 7. It has a basic field magnet 1 (for example an axially superconducting air-core coil magnet with active scatter field shielding) that generates a homogenous magnetic basic field in one direction, for example the z-direction, in an inner chamber. The superconducting magnet 1 internally has superconducting coils that are located in liquid helium. The basic field magnet 1 is surrounded by a two-part shell that is normally made from stainless steel. The inner shell, which contains the liquid helium and also serves in part as a winding body for the magnet coils, is suspended over weakly heat-conducting glass fiber-reinforced rods (rods) on the outer shell, which is at room temperature. Vacuum prevails between inner and outer shell.

The cylindrical gradient coil 2 inside the basic field magnet 1 is concentrically inserted inside the support tube by means of support elements 7. The support tube is externally bounded by an outer shell 8, internally by an inner shell 9.

The gradient coil 2 has three windings that generate respective gradient fields perpendicular to one another and proportional to the respectively applied current. As shown in FIG. 8, the gradient coil 2 has an x-coil 3, a y-coil 4 and a z-coil 5 that are respectively wound around the coil core 6 and thus generate gradient fields in the directions of the Cartesian coordinates x, y and z.

The x-coil 3 and the y-coil 4 are of a type known as saddle coils that overlap in the edge regions, are generally rotated counter to one another by 90° relative to the z-axis. The z-coil 5 is a conventional Maxwell coil.

Since the magnetic resonance frequency is directly dependent on the magnetic field strength, the same field strength should prevail in the defined measurement volume at each point in this volume. This is important for the spatial resolution or imaging and for the reproducibility of frequency spectra in spectroscopic imaging, in which field distortions caused by the susceptibility of the measurement subject must be subsequently corrected.

Among others, two shimming techniques are known for the homogenization of the basic field magnet:

1. A further orthogonal coil system with current flowing therein is located within the gradient coil 2, with which it is possible to homogenize the base field magnet. These additional correction coils 10 (shim coils) (FIG. 9) serve to compensate field inhomogeneities of a higher order and are therefore of very complicated design.

2. For homogenization of the basic field magnet, a suitable arrangement of iron plates 1 (shim plates) (FIG. 9) to be mounted in the magnet bore—meaning inside the gradient coil of between gradient coil and basic field magnet—is calculated with a field calculation program. An advance measurement of the field distribution serves as a requirement for the calculation. After the mounting, another calibration measurement is implemented. This event must be repeated multiple times before a satisfactory shim result is achieved.

While the technique under point 1 represents an active shim, the technique under point 2 is designated as a passive shim.

Both gradient coils and shim coils are produced from lacquer-insulated copper flat wire 13 that exhibits a rectangular cross-section according to FIG. 6. The wire 13 is wound to the coil in special winding shapes (two-dimensional with saddle coils) and adhered to a carrier 12 (FIG. 6). This is subsequently curved into the shape corresponding, for example, to the saddle coil and mounted on the gradient coil 2. In the next step, the coils are connected by the coil ends being soldered with current supply cables and thus are connected with the gradient power supply or the shim power supply.

It is the object of the gradient power supply to generate (with precise amplitude and timing) current pulses corresponding to the sequence programmed in the pulse sequence controller. The necessary currents are at approximately 250 A, the current rise rates are in the range of 250 kA/s.

Under such conditions, a great deal of heat (that can only be dissipated by active cooling) is created due to electrical power loss in the gradient coils and in the shim coils. According to the prior art, this is realized (as shown in FIG.

6) by plastic or copper heat exchangers 18 that are initially brought into the best possible contact with the respective coils. Coils 13 and heat exchangers 18 are subsequently provided with a chilled casting 16 to achieve the necessary mechanical stability.

This chilled casting 16 is normally formed of an epoxy resin hardened with acid anhydride, with quartz powder as a filler, and exhibits the necessary high values for insulation resistance and partial discharge stability. The heat conductivity is, however, only at 0.8 W/mK, such that the heat dissipation from the coil 13 ensues only insufficiently at the perimeter of the heat exchanger 18. Additionally, the contact area between coil 13 and heat exchanger 18 is very small, since due to its geometry—cooling coil with annular cross-section—only a line-shaped bearing surface results. A more effective heat transfer is, however, primarily thereby prevented since the material of the present plastic heat exchanger 18 is a commercially available thermoplastic synthetic with a heat conductivity of only approximately 0.2 W/mK. Due to the wall thickness necessary based on the pressure resistance, this represents the decisive heat resistance.

A copper heat exchanger—as it is presently used—in fact overall forms a larger contact area with the coil to be cooled, since the cross-section of the copper tube is fashioned rectangular; however, it is exhibits other non-negligible disadvantages: the design of such a copper heat exchanger is very elaborate in terms of construction, since the curvature of a rectangular (in cross-section) tube involves cross-section modifications. It must therefore be soldered at reversal points, which leads to quality risks and increased production costs. A further large disadvantage of an electrically-conductive heat exchanger in the form of a copper heat exchanger is the fact that magnetic field changes generated by the gradient coils induce in it eddy currents that are transduced into heat (due to the ohmic resistance) and heat the cooling tubes.

Furthermore, it is known to press or to mount the gradient coils (saddle coils and Maxwell coil) onto a highly heat-conductive ceramic cylinder.

WO/94/20862 discloses a gradient coil system with a double-walled ceramic cylinder made from silicon nitride, aluminum oxide or, respectively, a mixture thereof with markedly high heat conductivity (>3 W/mK). Coolant fluid (for example water) flows through the plenum, such that a flowing water jacket is created via which the heat of the cylinder and the gradient coils in contact with the cylinder is dissipated.

Due to increasing requirements for the capacity of modern gradient systems, this also means an increase in the heat to be dissipated. If the heat is not sufficiently dissipated, the sealing compound, for example, heats above the glass transition temperature at which it changes from mechanically solid into the rubber-elastic state, which leads to drastic changes of the mechanical properties. The heating of the sealing compound would likewise involve a heating of the shim iron plates and, as a result, a distortion of the magnetic fields, which would negatively affect the image quality of the MR exposures. In particular in magnetic resonance tomography systems for whole-body examinations, a good cooling of the gradient and shim coils is particularly necessary because the patient lies inside the gradient coil subassembly (fashioned tube-shaped) and a significant heating would represent an unacceptable stress of the patient.

SUMMARY OF THE INVENTION

It is an object of the present invention to provide a gradient coil system for a magnetic resonance apparatus with a more efficient cooling, wherein the problems cited above are reduced or prevented.

This object is achieved in accordance with the invention by a gradient coil system for a magnetic resonance apparatus with gradient coils (for coding of the magnetic base field) that, as elements to be cooled, are in thermal contact with cooling tubes for active cooling by means of a coolant. The cooling tubes are inventively formed of a flexible thermoplastic material, augmented with filler, that exhibits a heat conductivity greater than 0.5 W/mK.

The gradient coil system can include a passive shim system with one or more shim iron plates (to homogenize the magnetic base field) that, as further elements to be cooled, are in thermal contact with the cooling tubes.

Furthermore, the gradient coil system can include an active shim system with one or more shim coils (for the homogenization of the magnetic base field) that, as further elements to be cooled, are likewise in thermal contact with the cooling tubes.

In a first embodiment of the invention, the cooling tube is wound around one or more elements to be cooled and encapsulated with these into a unit by means of a sealing compound.

In a second embodiment of the invention, a number of cooling tubes directed in parallel are wound around the element to be cooled and encapsulated with this into a unit by means of a sealing compound.

In a third embodiment, the cooling tube is wound in a spiral or in a serpentine pattern on a carrier plate, affixed to this and pressed (on the cooling tube side) onto the element to be cooled.

The carrier plate with the cooling tube affixed thereon can be encapsulated with the element to be cooled into a unit by means of a sealing compound.

In a particularly advantageous embodiment of the present invention, one or more cooling tubes directed in parallel or in a serpentine or spiral pattern are encapsulated by means of a sealing compound into a unit designated as a cooling plate, this sealing compound being formed of a fluid reaction resin augmented with filler of a particularly high heat conductivity and exhibits a heat conductivity greater than 0.8 W/mK.

This cooling plate is brought into extensive thermal contact with the element to be cooled.

Such cooling plates can also be inserted into conductor spaces of the element to be cooled.

In order to ensure a certain mechanical stability, cooling plates and the element to be cooled are advantageously encapsulated into a unit by means of a sealing compound.

A further advantageous embodiment of the present invention is to encapsulate the current supply cable of the gradient or shim coils into the groove of a good heat-conducting plate with a sealing compound, this sealing compound being formed of a fluid reaction resin augmented with filler of a particularly high heat conductivity and exhibiting a heat conductivity greater than 0.8 W/mK.

DESCRIPTION OF THE DRAWINGS

FIG. 1 is a cross section of an inventive cooling plate cast in a conventional sealing compound.

FIG. 2 is a cross section of an inventive cooling plate.

FIG. 3 is a cross section of a portion of an inventive cooling plate mounted on a flat wire coil and encapsulated therewith to form a unit.

FIG. 4 is a cross section of a flat wire coil on which cooling coils in accordance with the invention are wound and encapsulated with a conventional sealing compound.

FIG. 9 schematically illustrates a conventional gradient coil system for a cylindrical basic field magnet, with integrated shim coils and geometrically distributed shim plates.

DESCRIPTION OF THE PREFERRED EMBODIMENTS

Figure 5:
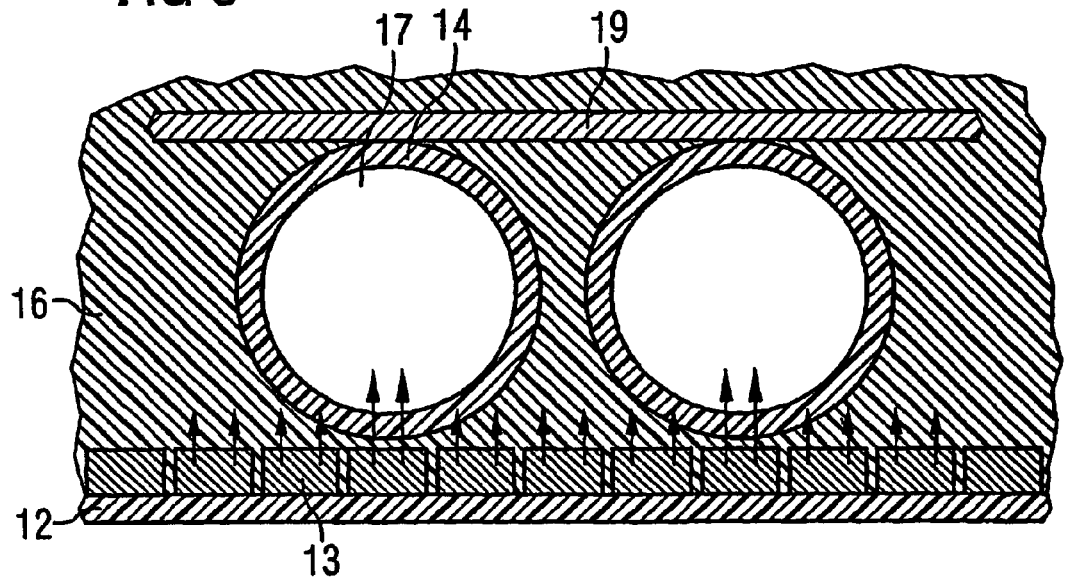
FIG. 5 is a cross section of a flat wire coil with which cooling coils in accordance with the invention are encapsulated on a carrier plate with a conventional sealing compound.
Figure 6:
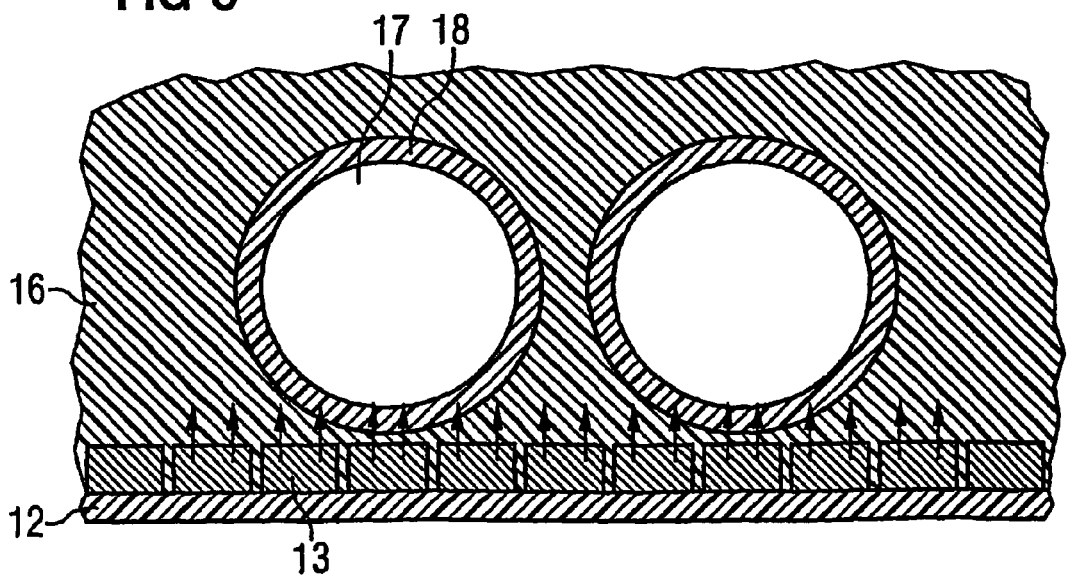
FIG. 6 is a cross section of cooling tubes composed of conventional material, mounted on a flat wire coil and encapsulated therewith to form a unit, using a conventional sealing compound.
Figure 7:
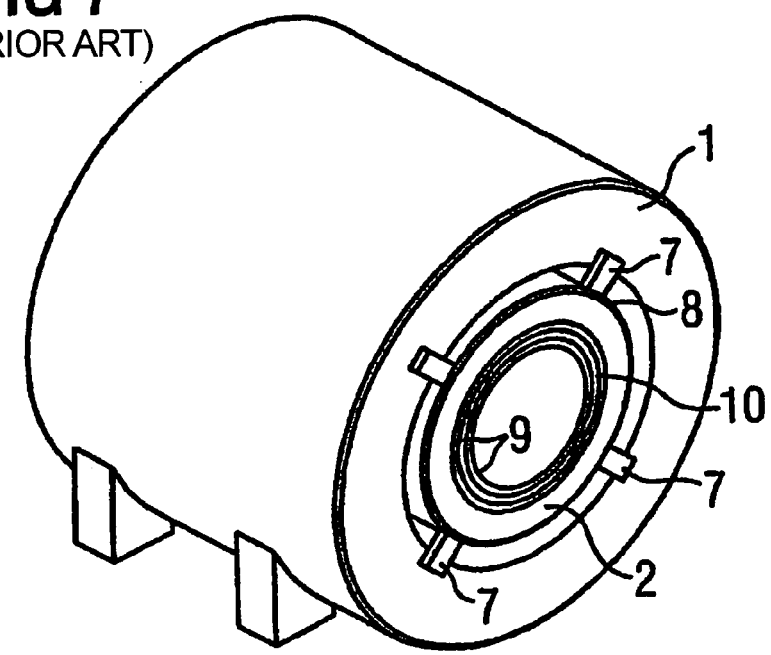
FIG. 7 is a perspective view of the basic field magnet of a conventional magnetic resonance imaging apparatus.
Figure 8:
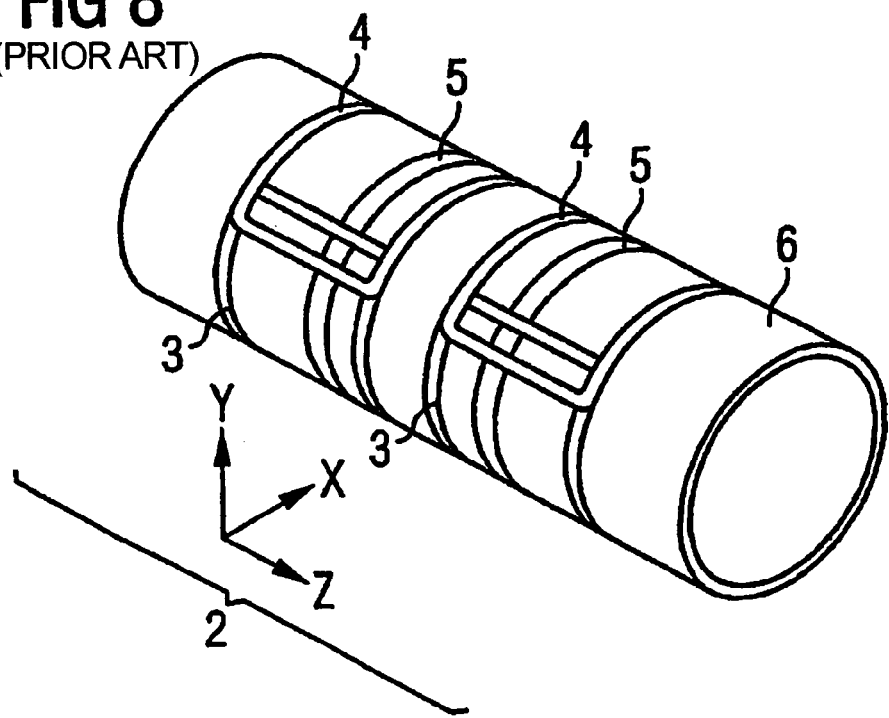
FIG. 8 is a perspective view of a conventional gradient coil, composed of three windings.

A cross-section of an embodiment of the present invention is shown in FIG. 1 in which serpentine cooling tubes 14 or cooling tubes 14 laid in parallel and made from a material according to the invention are encapsulated into a cooling plate in the placement plane with a sealing compound 15 also in accordance with the invention. This cooling plate with the integrated cooling tubes is embedded into a conventional sealing compound 16. Water is normally used as a coolant.

The material of the cooling tubes is comprised of a thermoplastic synthetic to which powdered, preferably electrically-insulating fillers with high heat conductivity have been added. For this reason, the heat conductivity of the cooling tube material is extraordinarily high in comparison to convention cooling tube materials. It is between 0.5 and 2 W/mK.

The thermoplastic synthetic is a thermoplastic elastomer from the group: TPE-U (thermoplastic elastomer on a polyurethane basis), TPE-A (thermoplastic elastomer on a polyamide basis), TPE-E (thermoplastic elastomer on a polyester basis), TPE-O (thermoplastic elastomer on a polyolefin basis), styrol-block-copolymers (SEBS block polymer, SBS block polymer), EPDM/PE mixtures, EPDM/PP mixtures, EVA or PEBA (polyether block amide).

The content of filler is between 15 and 50% of volume. The filler is selected from the group of the following fillers: quartz, aluminum oxide, magnesium oxide, aluminum nitride, silicon carbide, silicon nitride, boron nitride, zinc sulfide as well as mixtures thereof. However, it is also possible to replace the cited fillers partially or wholly with good heat-conducting powdered metals such as aluminum, copper, silver, etc. In principle, both fragmented, spherical, fibrous and plate-like particles can be used. It is advantageous with the maximum particle size of the filler to remain well below the wall thickness of the tube to be realized. The inner diameter of the tubes is typically between 1 mm and 20 mm given a wall strength of 0.05–5 mm. The cross-section of the tube can thereby be round or oval, or can even be comprised of a plurality of chambers separated by webs. Due to the elongation at tear of >15%, it is possible to process the produced tubes with a bending radius of <5 cm without tears or kinks. In spite of high flexibility, the inventive tubes exhibit a bursting pressure of >20 bar. They possess a rigidity of greater than 15 MPa and an elasticity module between 100 and 2000 MPa.

The sealing compound according to the invention in which the cooling tubes according to FIG. 1 are embedded essentially has the object of achieving a large contact area that should as such represent a large heat transfer surface via which an optimally good thermal contact to the embedded cooling tubes should be produced. The requirement that is placed on the sealing compound is therefore in the first place a very good heat conductivity. This is between 0.8 and 3 W/mK.

The sealing compound according to the invention is formed of a fluid reaction resin and a particulate filler that exhibits an increased heat conductivity. The fluid reaction resin is, for example, an epoxy resin, whereby the hardening into a polymerized duroplast material via acid anhydride, amine, phenol, mercaptane can, if necessary, occur with the addition of known reaction accelerators. However, reaction resins based on isocyanates, hardened with polyoles, are also possible. The fillers used can be quartz, aluminum oxide, magnesium oxide, aluminum nitride, silicon carbide, silicon nitride, boron nitride, zinc sulfide or mixtures thereof. Mixtures of various particle sizes can be used. A mixture of two different particle sizes is preferably used, whereby the average particle size of the first filler is less than half of the second filler. The average diameter of the first filler is in the range of 10–200 μm.

The fillers are separated into the resin and accelerator components, mixed under vacuum, and from this pre-mixtures are produced. The pre-mixtures thus prepared are mixed and evacuated in the correct ratio. In order to achieve a cooling plate according to FIG. 1, the tubes 14 are placed into a mold made from the novel material and intervening spaces between the tubes 14 are effused with the novel sealing compound 15, and this is hardened (cured) at temperatures up to 150° C.

The cross-section of such a cooling plate is shown in FIG. 2. The cooling tubes are laid in parallel and, for example at a distributor piece (not shown), go around the length of the individual tube and therewith to minimize the pressure loss. Due to the high flexibility of the novel tube material, as shown in FIG. 2 the bending radii can be realized smaller than 5 cm. This has the further great advantage (relative to conventional cooling tube materials) that overall the area to be cooled can be covered more advantageously or, respectively, effectively in, for example, meander- or spiral-shaped arrangement of the cooling tubes.

The heat flow (indicated in arrows) in a first embodiment of the inventive cooling system coil cooling tube is shown in FIG. 3. The corresponding coil 12 (gradient of shim coil), which is wound in the form of a flat wire 13 on a carrier 12, is significantly heated via corresponding current feed. A significant and uniformly distributed temperature gradient is created between coil and cooling tube over the entire contact (bearing) surface of the novel sealing compound 15 due to the flowing coolant 17 (for example water, oil, etc.), which is significantly colder than the heated coil. As one can recognize at the arrows, a very effect heat dissipation can occur since the heat flow at the cooling tubes ensues from the entire contact area based on the good heat conductivity of the novel sealing compound 15. Coil 13 and cooling plate 15 (with the cooling tubes 14 comprised therein) are encapsulated into a stable unit with a conventional sealing compound 16 in order to prevent air gaps between coil 13 and an inventive sealing compound 15, and therewith to increase the heat transfer and the partial discharge stability.

A second, significantly simpler embodiment of the inventive cooling system cooling tube is shown in FIG. 4. According to this simpler variant, the cooling tube (comprised of the inventive novel material) is simply wound on the coil (for example on the cylindrical z-gradient coil) and subsequently encapsulated with a conventional sealing compound 16. In this embodiment of the cooling system, based on the poor heat conductivity of the conventional sealing compound 16 the heat dissipation (as one can recognize using the arrows) significantly only occurs on the line-shaped contact area. The heat transfer region is therewith in fact relatively small; however, the heat transfer is always still higher than in the prior art due to the better tube material. As already mentioned, it is advantageous to wind a plurality of tubes in parallel around the length of the individual tube, and therewith to minimize the pressure loss.

A further third embodiment of the system coil cooling tube is shown in FIG. 5. It consists of winding the cooling tube, for example spiral- or meander-shaped, on a rigid or elastic carrier plate 19 and fixing it there. The synthetic heat exchanger 14-17-19 thus created is then pressed on the corresponding coil and encapsulated with a conventional compound 16 (or even the inventive compound 15—not shown) sealing compound. This synthetic heat exchanger 14-17-19 can be efficiently pre-fabricated corresponding to the geometric specifications via the coils. These pre-fabricated elements can likewise be placed into conductor intervening spaces specially provided for this during the coil design.

Naturally, a combination of the embodiments of the invention shown in FIGS. 3 and 5 is also conceivable. Thus, for example, the carrier plate with the cooling tube affixed thereon can also be encapsulated into a cooling plate using a particularly heat-conductive sealing compound, said cooling plate being subsequently pressed onto the element to be cooled.

It is further noted that the current supply cables of the coil ends are likewise significantly heated. For this reason, according to the prior art these cables are placed in a groove of a metal block (for example aluminum) and encapsulated with a two-component adhesive. It is not inventively proposed to encapsulate the current supply cables placed in the groove with the novel better heat-conducting sealing compound for better cooling. This is in particular also reasonable given a coaxial design of the current supply cables.

Although modifications and changes may be suggested by those skilled in the art, it is the invention of the inventors to embody within the patent warranted heron all changes and modifications as reasonably and properly come within the scope of their contribution to the art.

We claim as our invention:

1. A gradient coil system for a magnetic resonance apparatus comprising:
   a plurality of gradient coils each having a current supply cable;
   a cooling tube in thermal contact with at least one of said gradient coils, said cooling tube being adapted to contain a flowing coolant therein said cooling tube being comprised of a flexible, thermoplastic material augmented with a filler, said thermoplastic material having a heat conductivity greater than 0.5 W/mK;
   a carrier plate, said cooling tube and said gradient coils being attached to said carrier plate at a same side of said carrier plate, and said cooling tube being wound on said carrier plate in a pattern selected from the group consisting of a spiral pattern and a serpentine pattern; and
   a sealing compound encapsulating said cooling tube, said gradient coils and the current supply cables on said carrier plate to form a unit.

2. A gradient coil system as claimed in claim 1 comprising a passive shim system including at least one iron shim plate, said shim iron plate being in thermal contact with said cooling tube.

3. A gradient coil system as claimed in claim 1 comprising an active shim system including at least one shim coil in thermal contact with said cooling tube.

4. A gradient coil system as claimed in claim 1 wherein said cooling tube is wound around said gradient coils, wherein said gradient coil system comprises a sealing compound encapsulating said cooling tube with said coils to form a unit.

5. A gradient coil system as claimed in claim 1 comprising a plurality of cooling tubes wound around said gradient coils, and wherein said gradient coil system comprises a sealing compound encapsulating said plurality of gradient tubes and said coils to form a unit.

6. A gradient coil system as claimed in claim 1 wherein said sealing compound is comprised of a fluid reaction resin augmented with filler having a heat conductivity greater than 0.8 W/ink.

7. A gradient coil system as claimed in claim 1 wherein said gradient coils and said cooling tubes are in substantial area-wide thermal contact with said cooling plate.

8. A gradient coil system as claimed in claim 1 wherein said gradient coils have spaces therebetween, and wherein said cooling tube is disposed in said pattern in said spaces.

* * * * *